United States Patent
Mottura et al.

(10) Patent No.: US 6,689,627 B2
(45) Date of Patent: Feb. 10, 2004

(54) PROCESS FOR MANUFACTURING MICROMECHANICAL COMPONENTS IN A SEMICONDUCTOR MATERIAL WAFER WITH REDUCTION IN THE STARTING WAFER THICKNESS

(75) Inventors: Marta Mottura, Milan (IT); Alessandra Fischetti, Milan (IT); Marco Ferrera, Domodossola (IT); Bernardino Zerbini, Milan (IT); Mauro Bombonati, Abbiategrasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 33 days.

(21) Appl. No.: 10/037,484

(22) Filed: Dec. 19, 2001

(65) Prior Publication Data

US 2002/0127761 A1 Sep. 12, 2002

(30) Foreign Application Priority Data

Dec. 20, 2000 (EP) .............................. 00830835

(51) Int. Cl.[7] .................... H01L 21/00; H01L 21/46; H01L 21/78; H01L 21/322; H01L 21/461
(52) U.S. Cl. ..................... 438/24; 438/50; 438/52; 438/456; 438/459; 438/481; 438/691; 438/734; 438/761
(58) Field of Search ................... 438/456, 459, 438/481, 761, 50, 52, 24, 691, 734

(56) References Cited

U.S. PATENT DOCUMENTS

| | | | |
|---|---|---|---|
| 4,875,086 A | * 10/1989 | Malhi et al. | 257/506 |
| 5,043,043 A | 8/1991 | Howe et al. | 156/645 |
| 5,659,192 A | 8/1997 | Sarma et al. | 257/347 |
| 5,705,318 A | * 1/1998 | Mehregany et al. | 430/312 |
| 5,906,708 A | * 5/1999 | Robinson et al. | 438/694 |
| 5,920,013 A | 7/1999 | Boardman et al. | 73/514.32 |

FOREIGN PATENT DOCUMENTS

| | | |
|---|---|---|
| EP | 0 207 272 A2 | 1/1987 |
| EP | 0 520 216 A3 | 12/1992 |
| WO | WO 93/26041 | 12/1993 |

OTHER PUBLICATIONS

Gui, C. et al., "Fabrication of Multi–Layer Substrates for High Aspect Ratio Single Crystalline Microstructures," *Sensors and Actuators A*, 70(1–2):61–66, Oct. 1, 1998.

* cited by examiner

Primary Examiner—Olik Chaudhuri
Assistant Examiner—William M Brewster
(74) Attorney, Agent, or Firm—Lisa K. Jorgenson; Harold H. Bennett II; Seed IP Law Group PLLC

(57) ABSTRACT

A process for manufacturing components in a multi-layer wafer, including the steps of: providing a multi-layer wafer comprising a first semiconductor material layer, a second semiconductor material layer (, and a dielectric material layer arranged between the first and the second semiconductor material layer; and removing the first semiconductor material layer initially by mechanically thinning the first semiconductor material layer, so as to form a residual conductive layer, and subsequently by chemically removing the residual conductive layer. In one application, the multi-layer wafer is bonded to a first wafer of semiconductor material, with the second semiconductor material layer facing the first wafer, after micro-electromechanical structures have been formed in the second semiconductor material layer of the multi-layer wafer.

19 Claims, 7 Drawing Sheets

PROCESS FOR MANUFACTURING MICROMECHANICAL COMPONENTS IN A SEMICONDUCTOR MATERIAL WAFER WITH REDUCTION IN THE STARTING WAFER THICKNESS

BACKGROUND OF THE INVENTION

1. Field of the Invention

The present invention refers to a process for manufacturing components in a semiconductor material wafer with reduction in the starting wafer thickness.

2. Description of the Related Art

As is known, various processes have been developed for manufacturing micro-electromechanical structures, such as micromotors or microactuators usable for finely controlling the position of heads in hard disk drivers.

According to some of these processes, both the micro-electromechanical structures (or microstructures, as referred to hereinafter) and control circuits for controlling the microstructures are made in a same semiconductor material wafer. In a known process, the microstructures are formed according to the following steps:

deposition of a sacrificial layer on the substrate of the wafer;

growth of an epitaxial layer;

definition of rotor regions and stator regions, comprising suspended portions, in the epitaxial layer; and removal of the sacrificial layer to free the suspended portions of the rotor and stator regions.

In this way, the microstructures may be formed by processing a single face of the semiconductor wafer.

More recently, the use of two distinct semiconductor wafers has been proposed. In a first wafer, the microstructures are formed by deposition of a sacrificial layer, epitaxial growth, and definition of the rotor and stator regions described above, while a second wafer is used as a support for the microstructures. In addition, in the second wafer the control circuits for controlling the microstructures may be formed.

Before removing the sacrificial layer, the two wafers are bonded together, so that the face of the first wafer where the microstructures have been formed is set facing the second wafer. Subsequently, the substrate of the first wafer is partially removed using a mechanical process (milling), so that a residual portion of substrate is obtained having a given thickness, normally of approximately 10–100 $\mu$m. Next, trenches are formed having a such depth to reach the sacrificial layer, which is finally removed so as to free the suspended portions of the rotor and stator regions.

The process described above has, however, certain drawbacks, mainly linked to the step of milling the substrate of the first wafer. In fact, since the final thickness to be achieved is in any case small (10–100 $\mu$m), the mechanical stresses generated by the mechanical members, especially at the end of the milling step, may cause cracks in the semiconductor wafer, in particular in the rotor and stator regions, thus rendering the wafer unusable. A somewhat high number of wafers must thus be discarded, and the process, which falls short of optimal yield, is, on the whole, costly. In addition, the milling process does not enable an accurate control of the thickness of the residual portion of substrate to be obtained.

The same problem is encountered also in electrical circuits formed in a wafer of semiconductor material which, for some reason, is to be thinned.

BRIEF SUMMARY OF THE INVENTION

An embodiment of the present invention provides a process for forming components (whether electronic components or micro-electromechanical structures), that enables a reduction in the mechanical stresses acting on the semiconductor material wafer the thickness of which is to be reduced.

According to an embodiment of the present invention, there is provided a process for manufacturing components in a multi-layer wafer. The process includes the steps of providing a multi-layer wafer comprising a first semiconductor material layer, a second semiconductor material layer, and a dielectric material layer arranged between the first and the second semiconductor material layer, then removing the first semiconductor material layer, initially by mechanically thinning the first semiconductor material layer, so as to form a residual conductive layer, and subsequently by chemically removing the residual conductive layer. In one application, the multi-layer wafer is bonded to a first wafer of semiconductor material, with the second semiconductor material layer facing the first wafer, after micro-electromechanical structures have been formed in the second semiconductor material layer of the multi-layer wafer.

BRIEF DESCRIPTION OF THE SEVERAL VIEWS OF THE DRAWINGS

For a better understanding of the present invention, embodiments thereof are now described, purely to provide non-limiting examples, with reference to the attached drawings, wherein.

In the ensuing description, reference will be made to the process for manufacturing a composite wafer obtained by assembling a first semiconductor material wafer incorporating encapsulated microstructures (for example, microactuators) and a second semiconductor material wafer containing control circuits for controlling the microactuators and pre-amplification circuits.

DETAILED DESCRIPTION OF THE INVENTION

Figure 1:
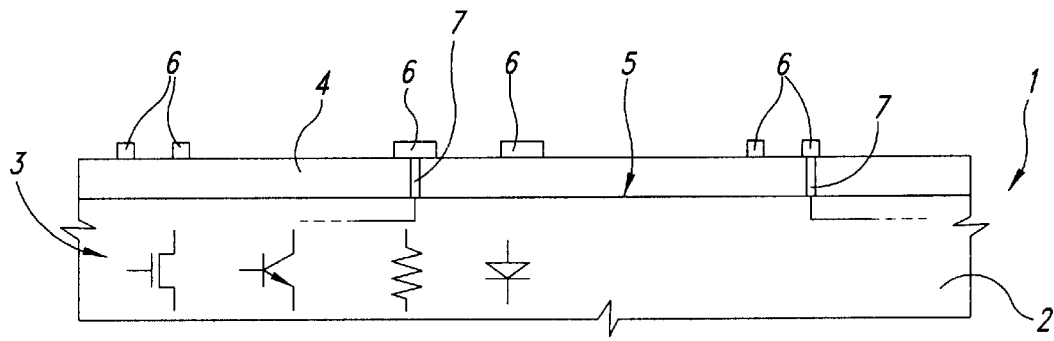
FIGS. 1 and 2 show cross-sections of two starting wafers used in an embodiment of the process according to the invention.

According to FIG. 1, a first wafer 1, comprising a body 2 of semiconductor material, for instance monocrystalline silicon, initially accommodates a control and pre-amplification circuit 3, of a known type and represented in a schematic and simplified way through active and passive components. The control and pre-amplification circuit 3 is obtained via standard processing steps, which are not shown in detail.

Subsequently, an insulating layer 4, for example BPSG, is deposited on a surface 5 of the body 2 and is excavated, then connections 7 are formed. Then, via standard steps of deposition and photolithographic definition, metal regions 6 are provided on top of the insulating layer 4. The metal regions 6, which have functions of electrical connection and bonding, as is explained hereinafter, are electrically connected to the control and pre-amplification circuit 3 and are preferably made using chromium-palladium.

Figure 2:
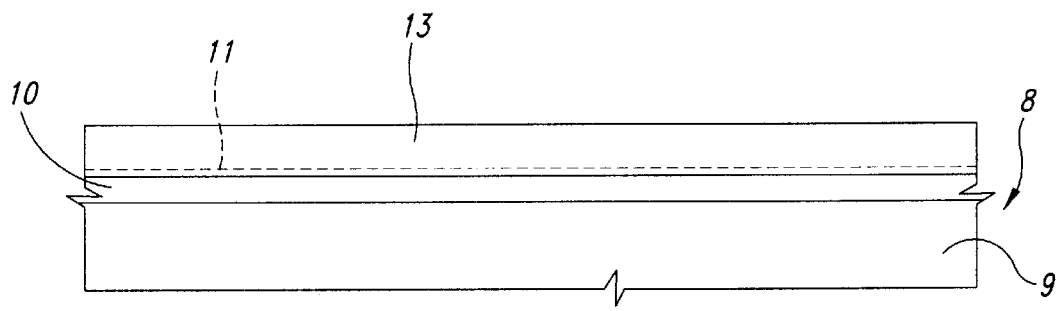

With reference to FIG. 2, on a second wafer 8 of semiconductor material, comprising a monocrystalline substrate 9 having a thickness of, for example, 675 $\mu$m, a silicon-dioxide layer is grown, intended to form a stop layer 10.

Next, a polycrystalline-silicon germ layer 11 (indicated by a dashed line) is deposited on top of the stop layer 10, an then a first epitaxial layer 13 is grown, which has a preset thickness of, for example, 10 $\mu$m. At the end of the epitaxial growth, a structure is thus obtained which has two conductive regions (the substrate 9 and the first epitaxial layer 13) separated by a buried insulating region (stop layer 10). In this case, one of the conductive regions is made of monocrystalline silicon (substrate 9) and the other of polycrystalline silicon (first epitaxial layer 13). The second wafer 8 is then planarized via chemical-mechanical planarization (CMP).

Figure 3:
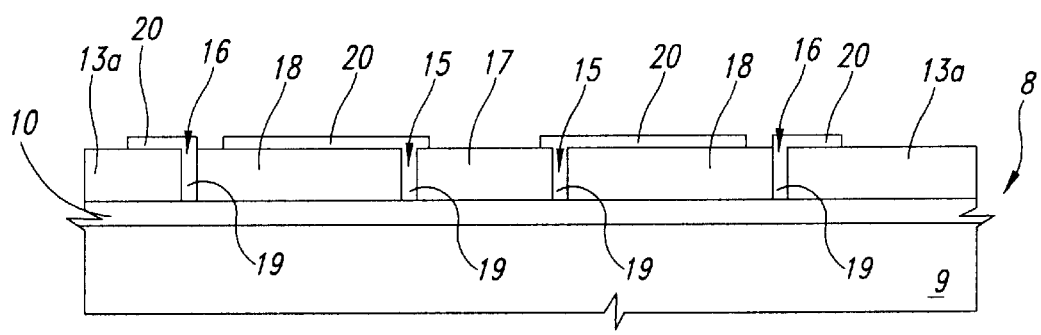
FIGS. 3–5 show cross-sections of the wafer of FIG. 2, in successive processing steps.
Figure 6:
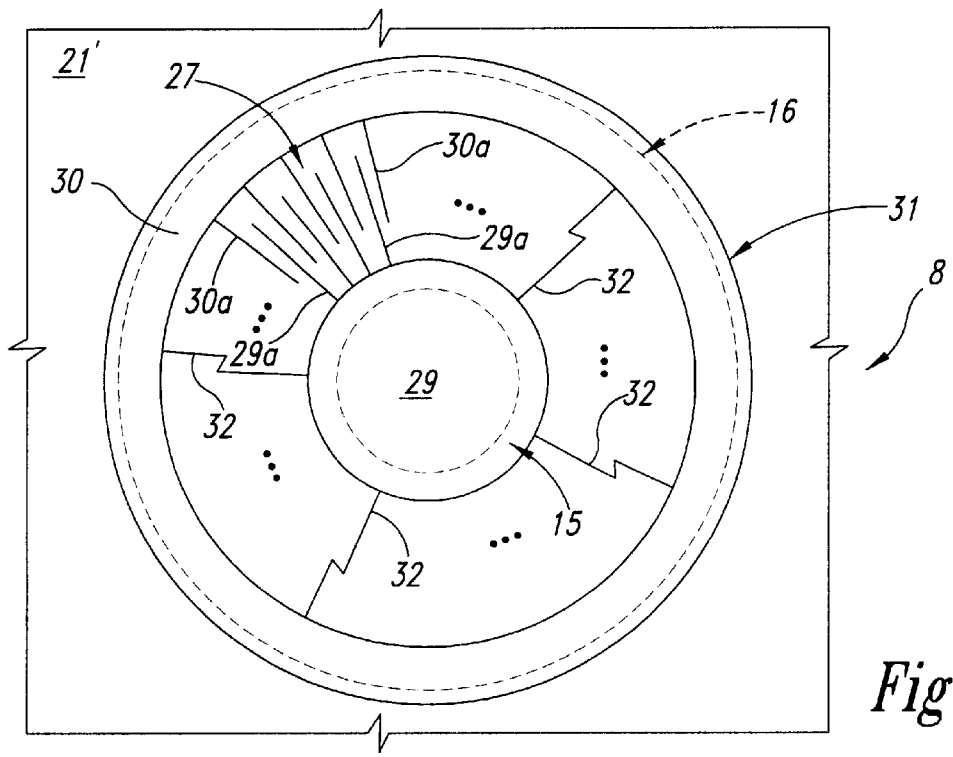
FIG. 6 shows a top plan view of the wafer of FIG. 5.

Next, using standard trench etching, a first trench 15 and a second trench 16 are formed, which are circular and concentric and extend in depth until they come into contact with the stop layer 10 (FIG. 3; the shape of the trenches 15, 16 in plan view is shown in FIG. 6 by a dashed line). The first trench 15, which has a smaller radius, delimits a first supporting region 17. A second supporting region 18, having annular shape, is enclosed between the first trench 15 and the second trench 16, and is separated from an external portion 13a of the first epitaxial layer 13 by the second trench 16.

Subsequently, a sacrificial layer, for example of silicon dioxide, is deposited and fills the trenches 15, 16, forming portions of oxide 19, and is then selectively removed from the surface of the first epitaxial layer 13 so as to form sacrificial regions 20 and expose portions of the first supporting region 17, portions of the second supporting region 18, and portions of the external portion 13a of the first epitaxial layer 13.

Figure 4:
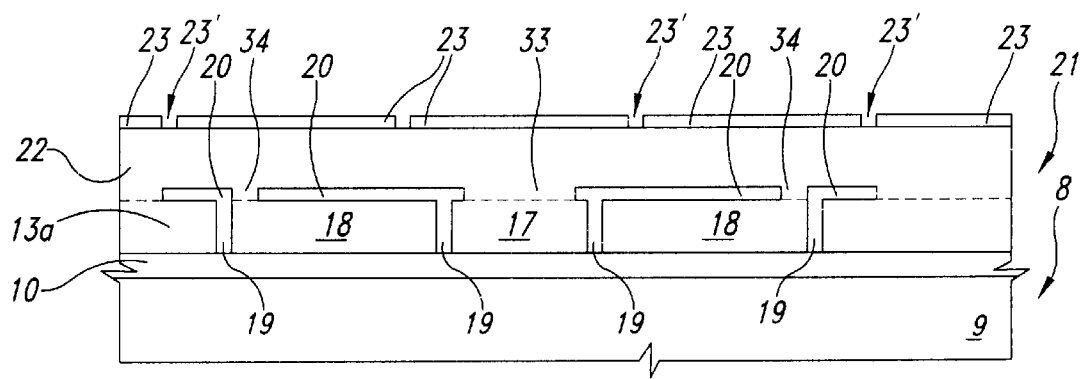

After depositing a second polycrystalline-silicon germ layer (not shown), a second epitaxial layer 22 is grown (FIG. 4), so as to form an epitaxial region 21 including the first and second epitaxial layer 13, 22. The epitaxial region 21 has an overall thickness preferably of between 10 $\mu$m and 100 $\mu$m (for example, 45 $\mu$m). The second wafer 8 is then once again planarized via CMP.

Figure 5:
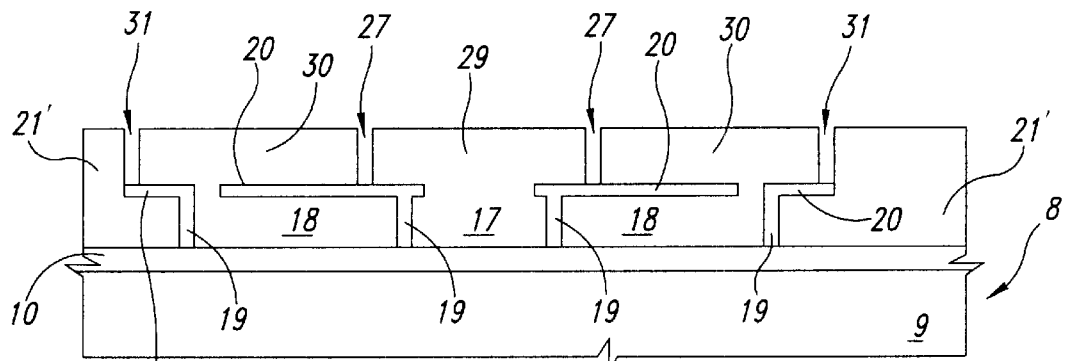

Subsequently, a hard mask 23 is formed which covers the second epitaxial layer 22 except for windows 23' overlying the sacrificial regions 20, and the second epitaxial layer 22 is deeply etched—performing for example an advanced silicon etch (ASE)—which stops on the sacrificial regions 20 (FIG. 5). In this processing step are formed a third trench 27, which separates a stator 29 from a rotor 30, and a fourth trench 31, which externally defines the rotor 30 and separates it from an external epitaxial portion 21' of the epitaxial region 21 (FIGS. 5 and 6).

In a per se known manner, the stator 29 and the rotor 30, connected together via spring regions 32, have stator arms 29a and, respectively, rotor arms 30a, comb-fingered (FIG. 6). In addition, the stator 29 is anchored to first supporting region 17, and the rotor 30 is anchored to the second supporting region 18.

The sacrificial regions 20 are then removed through a selective etch having a preset duration, which does not remove the oxide portions 19 inside the first trench 15 and the second trench 16. During etching, the stator arms 29a and the rotor arms 30a are freed, thus remaining suspended.

Figure 7:
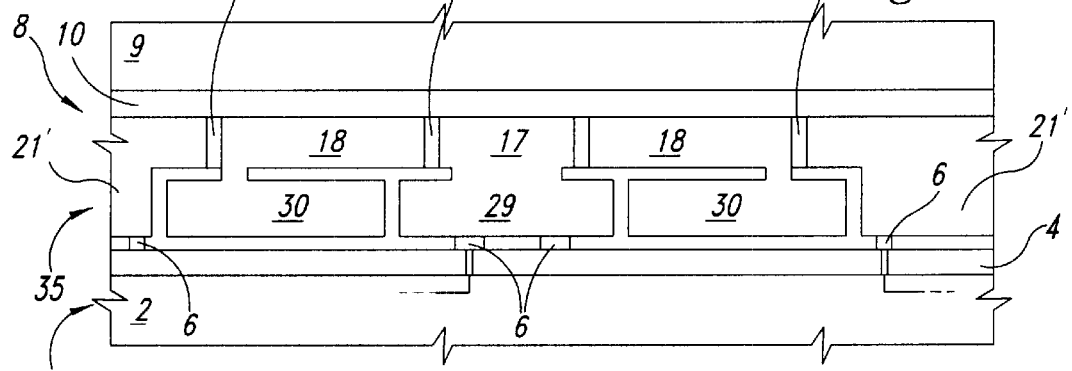
FIGS. 7–12 show cross-sections of a composite wafer in successive processing steps.

Subsequently (FIG. 7), the second wafer 8 is turned upside down, aligned and welded to the first wafer 1 (in which the control and pre-amplification circuits 3 are made) so that the stator 29 and the rotor 30 are facing the first wafer 1. A composite wafer 35 is thus formed. In particular, the metal regions 6 made on the first wafer 1 are welded to surface portions of the stator 29 and of the external epitaxial portion 21'.

Figure 8:
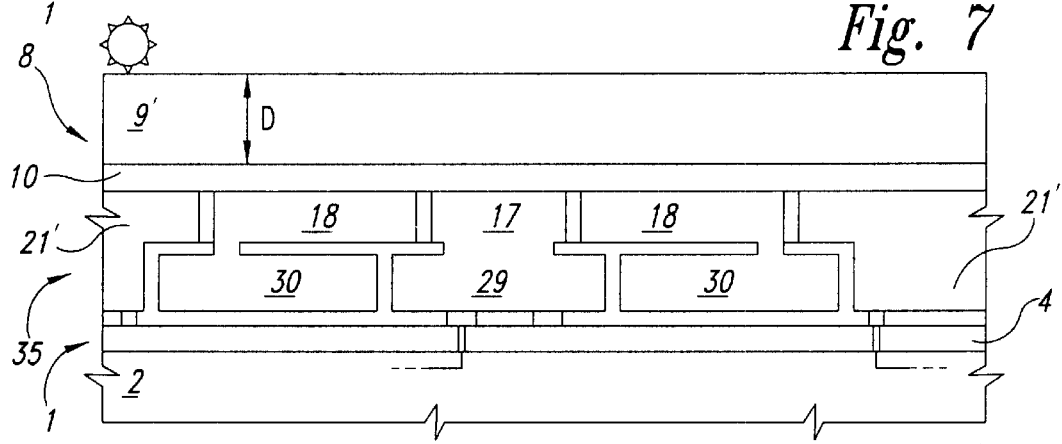

The substrate 9 of the wafer 8 is then removed via a process comprising at least two steps. Initially, the substrate 9 is thinned out by mechanical milling, which, according to the invention, is interrupted to leave a residual portion 9' having a preset thickness D, preferably of approximately 50 $\mu$m (FIG. 8). The thickness D of the residual portion 9' is such as to prevent the vibrations caused by the milling operation from producing cracks in the stator 19 and in the rotor 30, in particular in the stator arms 29a and rotor arms 30a, which are the parts more easily subject to damage.

Figure 9:
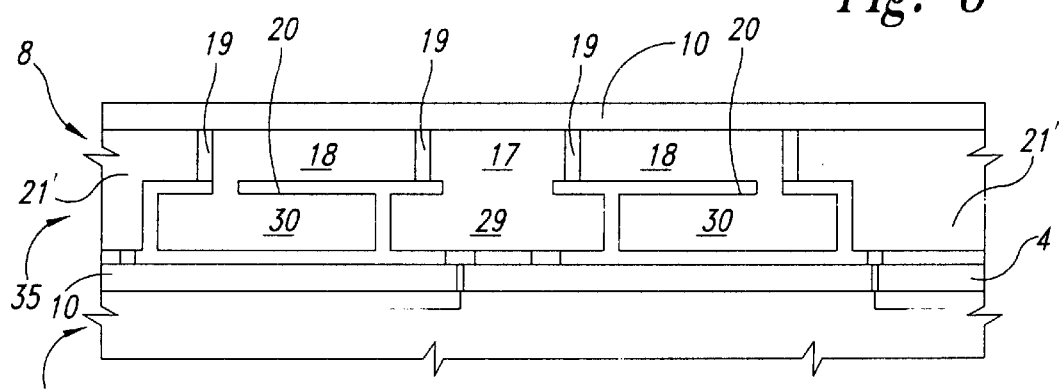

Subsequently (FIG. 9), the residual portion 9' is removed via chemical etching, for example a wet etch or a plasma etch that automatically stops on the stop layer 10 (of silicon dioxide), which is exposed and protects the underlying regions (external epitaxial region 21' and first and second supporting regions 17 and 18).

Next, through oxide etching, the stop layer 10 and the oxide portion 19 are removed. Thereby, the first supporting region 17 and second supporting region 18 are freed and rendered movable with respect to one another. Consequently, also the stator 29 (which is integral with the first supporting region 17) and the rotor 30 (which is integral with the second supporting region 18) are movable with respect to one another.

Figure 11:
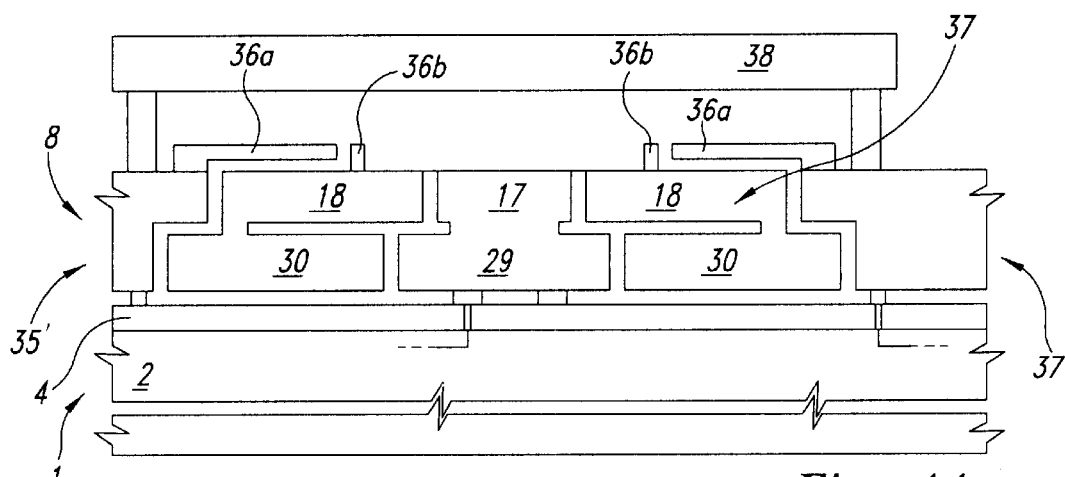
Figure 12:
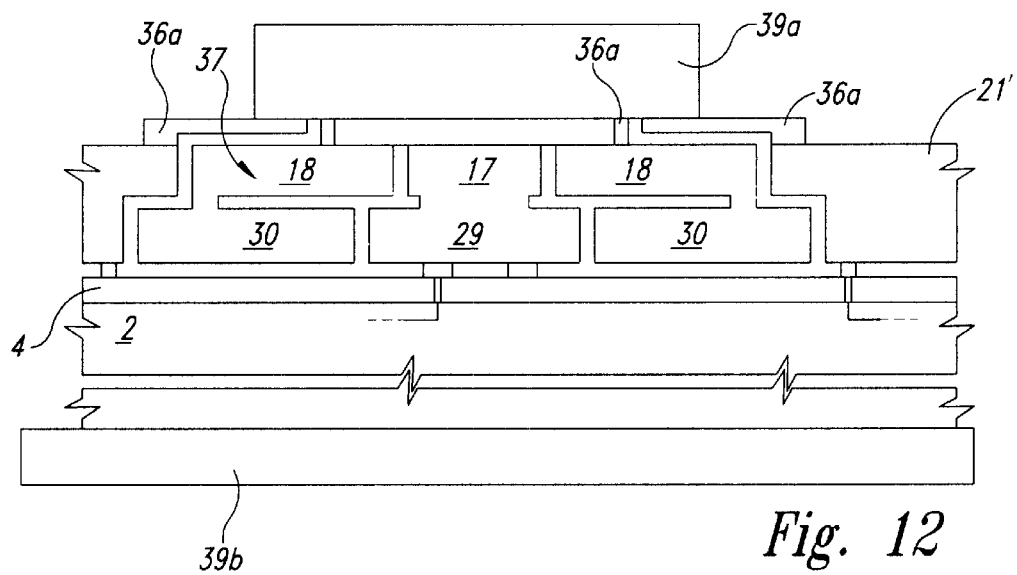

The process is then completed with known processing steps. In particular (FIG. 11), suspended connection lines 36a and contact regions 36b are formed; the body 2 of the wafer 1 is thinned by milling; and the composite wafer 35 is welded to a service wafer, for example of glass, and then cut, employing usual cutting techniques, to obtain a plurality of dice 35', each of which comprises a microactuator 37 connected to a respective protection chip 38. Finally (FIG. 12), the protection chip 38 is removed, and the microactuator 37 is assembled to a member that can be moved 39a (for example, a write/read head of a hard disk) and to a supporting member 39b (for example a suspension or gimbal).

According to a different embodiment of the invention, the process is used for obtaining a micromotor provided with a translating platform.

Figure 13:
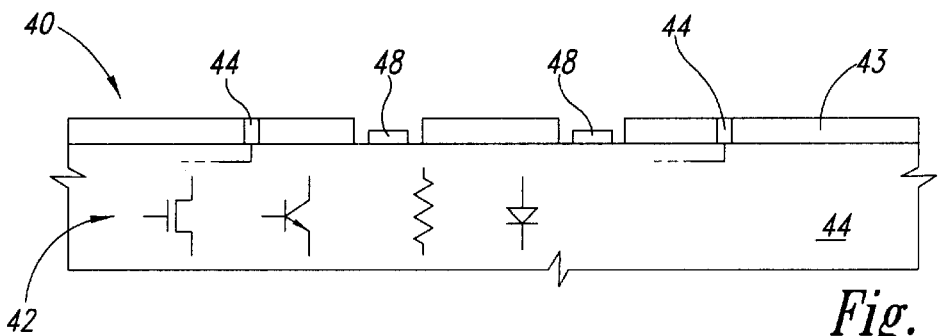
FIGS. 13 and 14 show cross-sections of two starting wafers used in a second embodiment of the process according to the invention.
Figure 14:
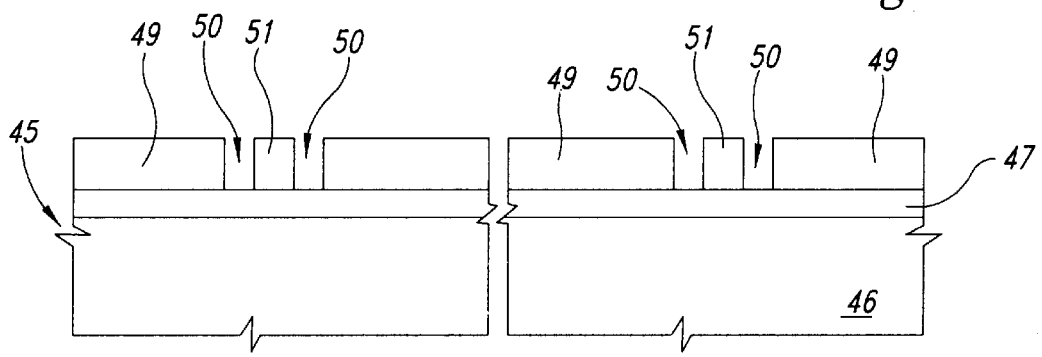

As shown in FIG. 13, initially a supporting wafer 40 is formed, basically as already illustrated with reference to FIG. 1. In particular, the supporting wafer 40 comprises a semiconductor material body 41, accommodating control circuits 42 (represented only schematically through active and passive electrical components) and an insulating layer 43, which is etched to form contact regions 44 (shown only schematically) on top of first actuation control regions 48, which are shorter in height than the contact regions 44.

With reference to FIGS. 14–21, on a wafer 46 (having a thickness of between 600 $\mu$m and 700 $\mu$m, for example 675 $\mu$m) a silicon dioxide layer is deposited to form a stop layer 47, and then an epitaxial layer 49 is grown having a thickness of, for instance, 100 $\mu$m.

Figure 21:
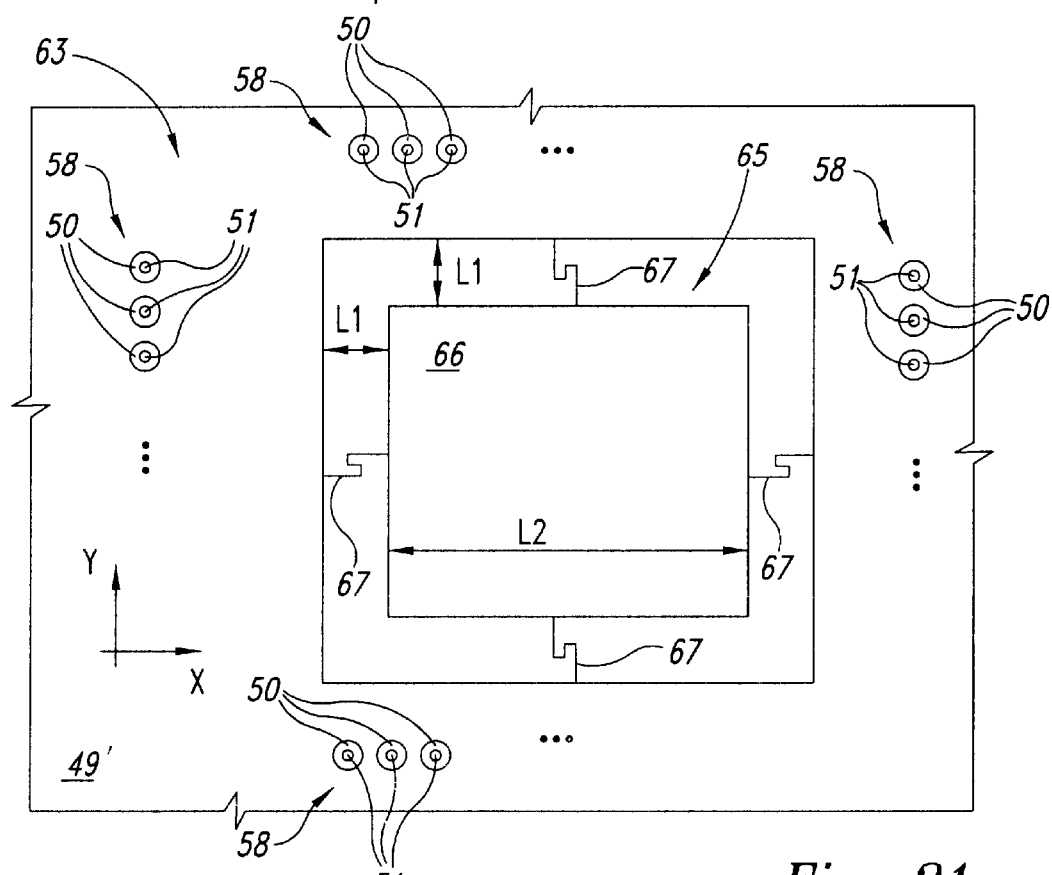
FIG. 21 shows a top plan view of the wafer of FIG. 19.
Figure 10:
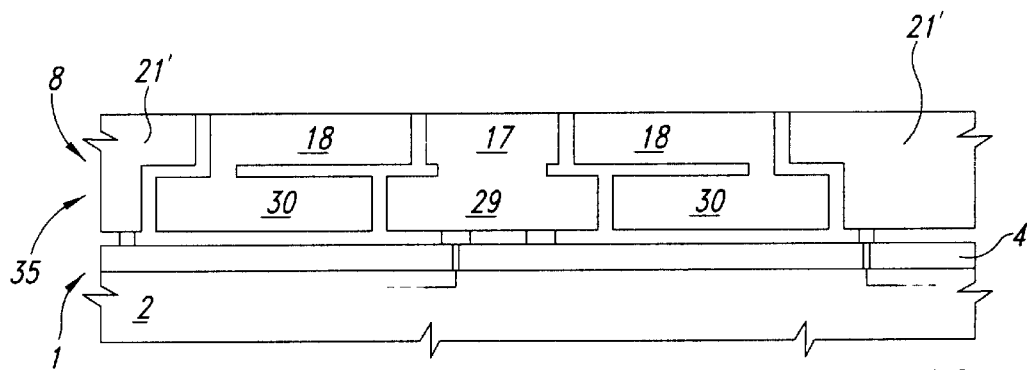

Subsequently (FIG. 14), via a trench etch, circular trenches 50 are formed having a depth such as to come into contact with the stop layer 47 (the circular trenches 50 are shown in plan view in FIG. 21). In detail, each of the circular trenches 50 delimits a respective cylindrical region 51; the cylindrical trenches 50 are arranged at equal distances and are made along the perimeter of a square designed to house the rotor element of a linear-type micromotor the side of which measures, for example, 3 mm.

Figure 15:
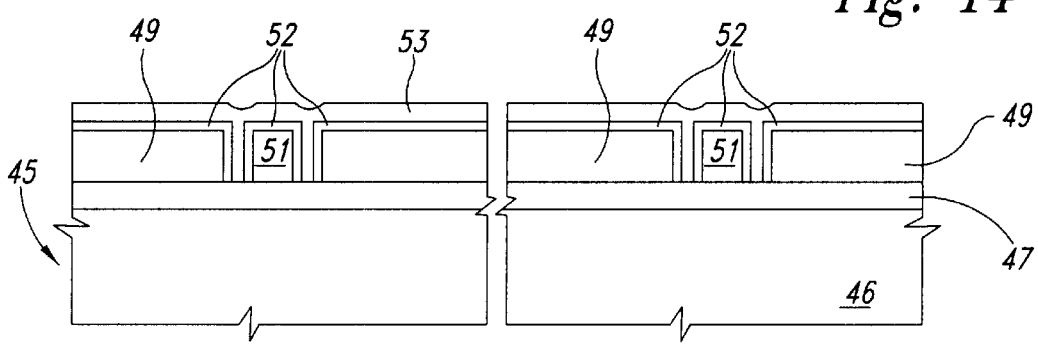
FIGS. 15 and 16 show cross-sections of the wafer of FIG. 13, in successive processing steps.
Figure 16:
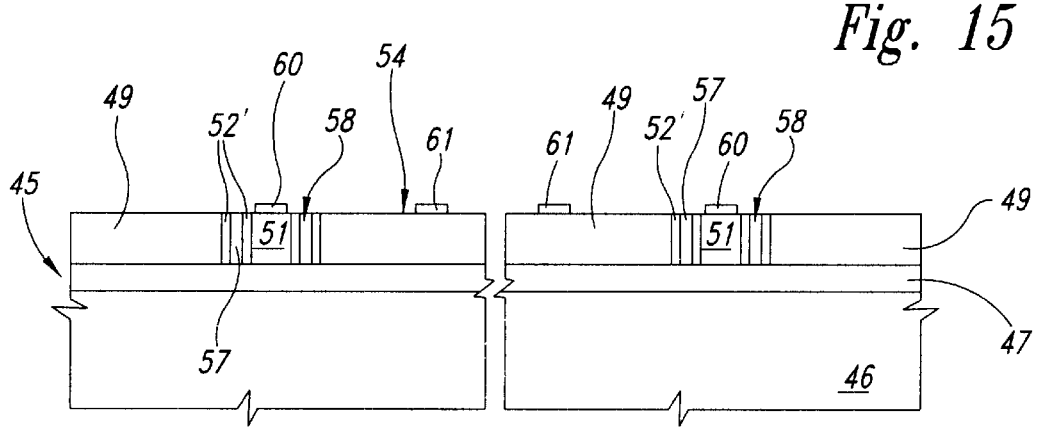

Via a thermal-oxidation step, an insulating layer 52 is then formed which covers the entire wafer 45 and, in particular, the walls of the circular trenches 50 (FIG. 15). Next, a conductive layer 53 is deposited, preferably of doped polycrystalline silicon, which fills the circular trenches 50. The conductive layer 53 and the insulating layer 52 are then dry-etched, so as to be removed from a surface 54 of the epitaxial layer 49, and subsequently wet-etched, so as to be removed from a bottom face (not shown) of the wafer 45 (FIG. 16).

Thereby, annular structures 58 are formed which comprise two insulating regions 52', set concentrically, and an intermediate conductive region 57. The annular regions 58 surround the cylindrical regions 51 (forming vias) and isolate them with respect to the outside world.

On top of the epitaxial layer 49, connection regions 60 and second actuation-control regions 61, for example of chromium-palladium, are then formed, with connection region 60 being positioned on the cylindrical regions 51.

Figure 17:
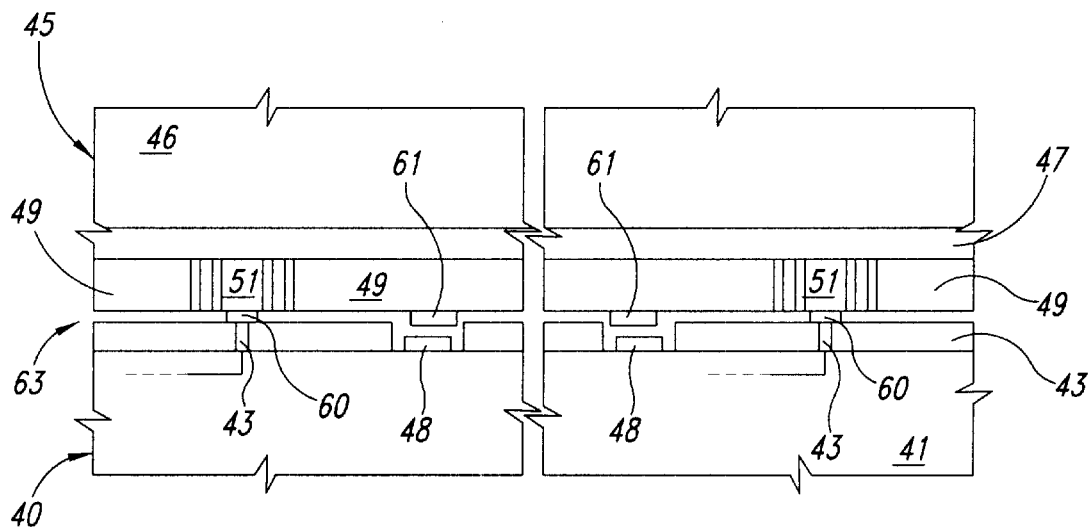
FIGS. 17–20 show cross-sections of a composite wafer in successive processing steps.

As shown in FIG. 17, the wafer 45 is then set upside down, aligned and welded to the supporting wafer 40. In particular, the connection regions 60 are aligned to the contact regions 43, thus electrically connecting the cylindrical regions 51 to the contact regions 43 and to the control circuits 42. The first and second control regions are set facing one another, even if they are not aligned, for the reasons explained hereinafter.

Figure 18:
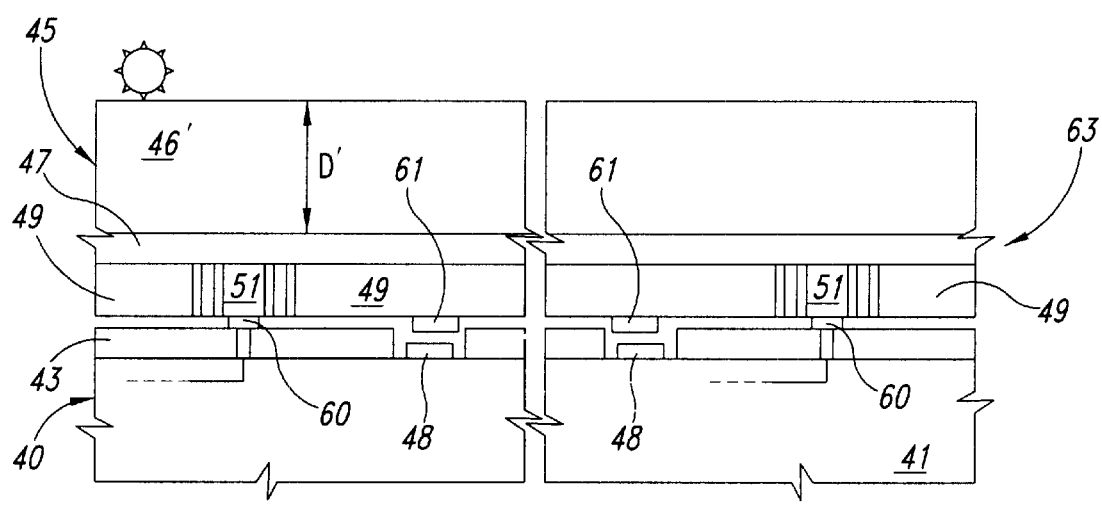
Figure 19:
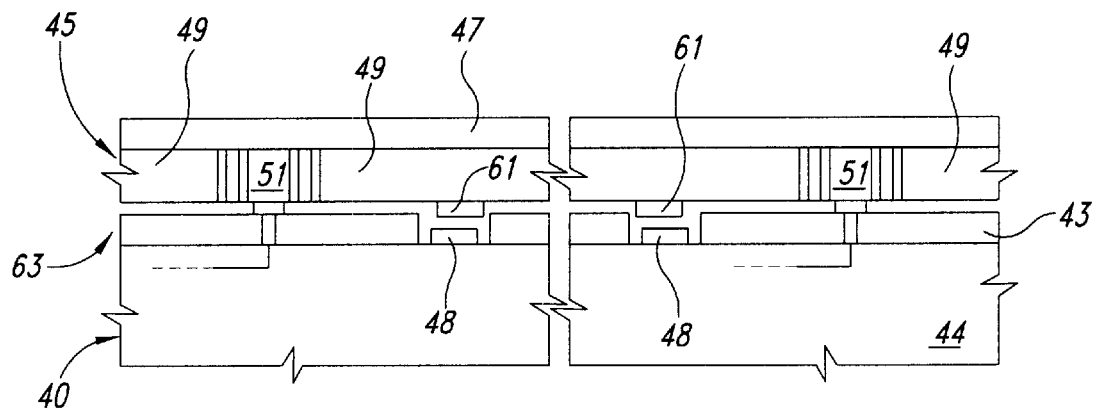

Subsequently, the substrate 46 is removed. In particular, first a milling step is performed to eliminate one part of the substrate 46 and to leave a residual portion 46' having a thickness D' of approximately 50 $\mu$m (FIG. 18). Next, also the residual portion 46' is removed, via chemical etching of the silicon, which is stopped by the stop layer 47 (FIG. 19). The etch may be either a wet etch or a plasma etch.

Figure 20:
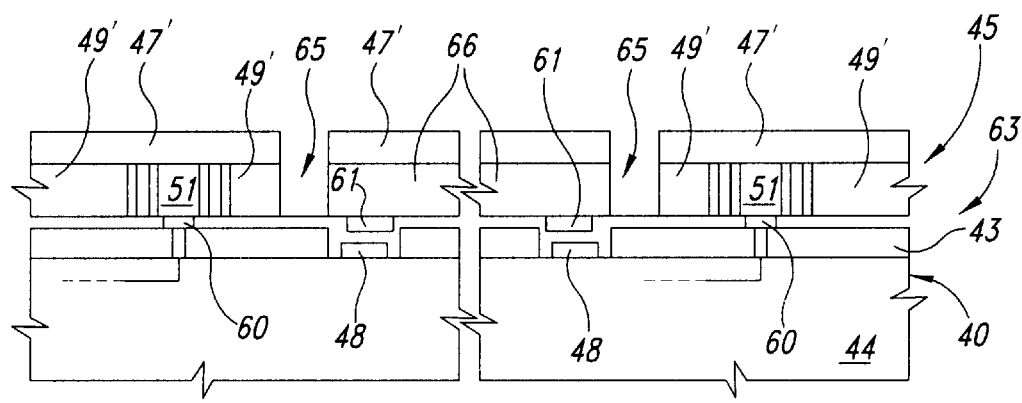

Through a photolithographic process, the stop layer 47 is selectively etched to form a mask 47' (FIG. 20). Using this mask 47', the epitaxial layer 49 is then etched, and a through trench 65 is formed which has a substantially square or rectangular shape; the mask 47' is then removed. In detail, the through trench 65 has a width L1 of, for instance, 25 $\mu$m, and delimits, within it, a platform 66 which is movable with respect to the epitaxial layer 49' along two directions X, Y, parallel to the drawing sheet plane and orthogonal to one another, as a result of the forces generated by the first and second actuation control regions 48, 61 when the latter are appropriately biased (FIG. 21). The platform 66, which preferably has a square shape, with a side length L2 of approximately 2 mm, is connected to the epitaxial layer 49' via springs 67 and is surrounded at a distance by the annular structures 58.

Finally, standard processing steps are carried out to complete a translating-platform micromotor.

The advantages of the method according to the present invention emerge clearly from the foregoing description. In particular, thanks to the presence of the stop region 10, 47, removal of the substrate 9, 46 of the wafer 8, 45 containing the microstructure (microactuator or micromotor) may be completed via a chemical etching step, thus considerably reducing any risk of cracks. The mechanical removal step (milling step) is in fact interrupted when the residual portion 9', 46' of the substrate 9, 46 to be eliminated still has a large thickness and is thus able, together with the stop layer 10, 47, to attenuate the stresses that propagate to the parts more easily subject to cracking. Consequently, the percentage of rejects is considerably reduced and the yield of the process is high.

Furthermore, the final thickness of the wafer containing the microstructure can be controlled with very high precision. This thickness is in fact basically determined by the duration of the epitaxial growth which leads to the formation of the layers 13, 49 and can be easily controlled using current techniques and machinery.

A further advantage lies in the fact that, after removing the stop layer 10, 47, the free surface of the epitaxial region has a low roughness, lower than that obtainable via planarization and polishing processes.

In addition, the stop layer 10, 47 may be advantageously used to form a silicon-etch mask, whenever this is required.

Finally, it is clear that modifications and variations may be made to the method described herein, without departing from the scope of the invention.

For example, it is possible to manufacture the microstructure starting from a silicon-on-insulator (SOI) wafer. In this case, the microstructure is made in a monocrystalline-silicon region, which can be advantageously exploited for forming also the signal control and pre-amplification circuitry. The wafer welded to the wafer containing the microstructure performs, instead, solely a supporting function. Using an SOI substrate, the process is simplified.

As has been pointed out, the process may be used also in case of an integrated circuit formed in a wafer comprising a substrate and an epitaxial layer separated from each other by an oxide layer, in which either the substrate or the epitaxial layer is removed in a final or in an intermediate step of the process.

The bonding regions used for welding the two wafers may be of a non-conductive type; for example, they may be made of glass paste.

What is claimed is:

1. A process for manufacturing components in a semiconductor material wafer, comprising:

forming a multi-layer wafer by forming a silicon dioxide layer on top of a semiconductor material layer, and growing a polycrystalline layer on top of said silicon dioxide layer; and forming suspended micromechanical structures inside said polycrystalline layer;

removing said semiconductor material layer, the removal step including the steps of:

mechanically thinning said semiconductor material layer, forming a residual semiconductor layer; and chemically removing said residual semiconductor layer.

2. The process according to claim 1, wherein said step of chemically removing comprises the step of using said silicon dioxide layer as a stop layer.

3. The process according to claim 1, wherein said step of mechanically thinning comprises the step of milling said semiconductor material layer.

4. The process according to claim 1, wherein said step of mechanically thinning comprises thinning said semiconductor material layer to a preset thickness.

5. The process according to claim 4, wherein said preset thickness is of approximately 50 μm.

6. The process according to claim 1, wherein said step of forming said multi-layer wafer comprises using a SOI-type wafer.

7. The process according to claim 1, further comprising, before said step of removing said semiconductor material layer, the steps of:

providing a first wafer of semiconductor material; and fixing said multi-layer wafer to said first wafer, with said polycrystalline layer facing said first wafer.

8. The process according to claim 7, wherein, before fixing said multi-layer wafer, the step is carried out of forming the suspended micromechanical structures inside said polycrystalline layer.

9. The process according to claim 8, wherein said step of forming suspended micromechanical structures comprises the steps of:

forming a sacrificial layer partially coating a first portion of said polycrystalline;

growing a second portion of said polycrystalline layer;

forming a first trench separating a stator region from a rotor region, and a second trench externally delimiting said rotor region; and removing said sacrificial layer.

10. The process according to claim 7 wherein, after said step of removing said semiconductor material layer, the step is carried out of forming a translating platform in said multi-layer wafer.

11. The process according to claim 10, wherein said step of forming a translating platform comprises the steps of:

defining said dielectric material layer to form a mask; and etching said polycrystalline layer using said mask to form a through trench delimiting said translating platform.

12. The process according to claim 1, further including removing said silicon dioxide layer after said step of chemically removing said residual semiconductor layer.

13. A method, comprising:

forming a dielectric layer on a semiconductor substrate;

forming an epitaxial layer on the dielectric layer;

mechanically removing a portion of the semiconductor substrate, leaving a remainder of the semiconductor substrate and the dielectric and epitaxial layers;

chemically removing the remainder of the semiconductor substrate, leaving the dielectric and epitaxial layers; and forming a micromechanical structure in the epitaxial layer prior to the thinning step.

14. The method of claim 13, further including forming a polycrystalline-silicon germ layer on the dielectric layer prior to forming the epitaxial layer.

15. The method of claim 13, further including removing the dielectric layer.

16. The method of claim 13, further including bonding a support layer to the epitaxial layer.

17. The method of claim 13 wherein the step of forming a micromechanical structure comprises:

forming trenches in the epitaxial layer delineating the micromechanical structure;

forming and defining a layer of sacrificial material on the epitaxial layer such that it fills the trenches and defines, on the surface of the epitaxial layer, portions of the micromechanical structure;

forming an additional epitaxial layer on the epitaxial layer;

forming trenches in the additional epitaxial layer further delineating the micromechanical structure;

bonding portions of the additional epitaxial layer to a support layer; and removing the sacrificial material.

18. A method, comprising:

forming a dielectric layer on a semiconductor substrate;

forming an epitaxial layer on the dielectric layer;

forming a micromechanical structure in the epitaxial layer;

mechanically removing a portion of the semiconductor substrate, leaving a remainder of the semiconductor substrate;

bonding a support layer to the micromechanical structure; and chemically removing the remainder of the semiconductor substrate.

19. A process for manufacturing components in a semiconductor material wafer, comprising:

depositing a dielectric material layer on top of a semiconductor material layer;

growing a polycrystalline layer on top of said dielectric material layer;

forming suspended micromechanical structures inside said polycrystalline layer; and removing said first semiconductor material layer, the removing step including the steps of:

mechanically thinning said first semiconductor material layer, forming a residual semiconductor layer; and chemically removing said residual semiconductor layer.

* * * * *

UNITED STATES PATENT AND TRADEMARK OFFICE
CERTIFICATE OF CORRECTION

PATENT NO. : 6,689,627 B2
DATED : February 10, 2004
INVENTOR(S) : Marta Mottura et al.

It is certified that error appears in the above-identified patent and that said Letters Patent is hereby corrected as shown below:

<u>Column 7,</u>
Line 20, "said polycrystalline;" should read as -- said polycrystalline layer; --.

Signed and Sealed this

Twenty-fifth Day of May, 2004

JON W. DUDAS
*Acting Director of the United States Patent and Trademark Office*